(12) United States Patent
Takahashi

(10) Patent No.: US 9,123,549 B2
(45) Date of Patent: Sep. 1, 2015

(54) SEMICONDUCTOR DEVICE

(71) Applicant: Sanken Electric Co., Ltd., Niiza-Shi, Saitama (JP)

(72) Inventor: Ryoji Takahashi, Niiza (JP)

(73) Assignee: Sanken Electric Co., Ltd., Niiza-Shi (JP)

( * ) Notice: Subject to any disclaimer, the term of this patent is extended or adjusted under 35 U.S.C. 154(b) by 0 days.

(21) Appl. No.: 14/488,656

(22) Filed: Sep. 17, 2014

(65) Prior Publication Data
US 2015/0091126 A1    Apr. 2, 2015

(30) Foreign Application Priority Data

Sep. 30, 2013  (JP) ................................. 2013-204822

(51) Int. Cl.
*H01L 29/02*    (2006.01)
*H01L 29/06*    (2006.01)
*H01L 29/40*    (2006.01)

(52) U.S. Cl.
CPC .......... *H01L 29/0634* (2013.01); *H01L 29/404* (2013.01); *H01L 29/407* (2013.01)

(58) Field of Classification Search
CPC ............ H01L 29/872; H01L 29/66143; H01L 29/1095; H01L 29/7816; H01L 29/7811; H01L 29/66727; H01L 29/404; H01L 29/0696; H01L 29/0615; H01L 29/0619; H01L 29/0634; H01L 29/6634
USPC .................................................. 257/488, 494
See application file for complete search history.

(56) References Cited

U.S. PATENT DOCUMENTS

| | | | |
|---|---|---|---|
| 2009/0194786 A1* | 8/2009 | Iwamoto et al. | 257/139 |
| 2011/0204442 A1* | 8/2011 | Guan et al. | 257/342 |
| 2012/0112306 A1* | 5/2012 | Onishi | 257/487 |
| 2013/0181328 A1* | 7/2013 | Cao et al. | 257/618 |

FOREIGN PATENT DOCUMENTS

JP        2000-277733 A    10/2000

* cited by examiner

*Primary Examiner* — Trung Q Dang
(74) *Attorney, Agent, or Firm* — Marvin A. Motsenbocker; Mots Law, PLLC

(57) ABSTRACT

A field limiting regions are arranged in the upper surface of a semiconductor region in the peripheral region and connected to upper portions of at least some of columnar regions. An insulating film is provided on the semiconductor region in the peripheral region and covering a field limiting region. A coupling plate electrode is provided above a pair of the field limiting regions adjacent to each other in a direction from a boundary between the element region and the peripheral region to an outer edge of the peripheral region. The joint field regions are in contact with one of the pair of field limiting regions on a boundary side in an opening formed in the insulating film, and reaching the other one of the pair of the field limiting regions on an outer edge side with the insulating film interposed therebetween.

9 Claims, 10 Drawing Sheets

SEMICONDUCTOR DEVICE

CROSS REFERENCE TO RELATED APPLICATIONS

This application claims priority based on 35 USC 119 from prior Japanese Patent Application No. 2013-204822 filed on Sep. 30, 2013, entitled "SEMICONDUCTOR DEVICE", the entire contents of which are incorporated herein by reference.

BACKGROUND OF THE INVENTION

1. Field of the Invention

This disclosure relates to a super junction structure semiconductor device with a structure to increase the breakdown voltage.

2. Description of Related Art

MOS transistors having a super junction (SJ) structure (hereinafter, referred to as SJMOSs), in which p-type columnar regions and n-type columnar regions are arranged next to each other, have characteristics of high breakdown voltage and low on-resistance (see Japanese Patent Application Publication No. 2000-277733, for example). In the SJ structure, the ratio of the total amount of impurities in the p-type columnar regions to that in the n-type columnar regions needs to be set to nearly one in order to completely deplete the drift region under reverse bias. To this end, in a semiconductor chip, the p-type and n-type columnar regions are regularly arranged in a certain repeated pattern.

SUMMARY OF THE INVENTION

According to an aspect of the invention, provided is a semiconductor device including an element region in which a semiconductor element is formed and a peripheral region provided around the element region, the semiconductor device including: a) a first conductivity-type semiconductor region formed in the element region and the peripheral region; b) second conductivity-type columnar regions provided in the semiconductor region of the peripheral region and each formed in a ring shape surrounding the element region; c) second conductivity-type field limiting regions arranged in the upper surface of the semiconductor region in the peripheral region and connected to upper portions of at least some of the columnar regions; d) an insulating film provided on the semiconductor region in the peripheral region and covering the field limiting regions; and e) a coupling plate electrode provided above a pair of the field limiting regions adjacent to each other in a direction from a boundary between the element region and the peripheral region to an outer edge of the peripheral region, the joint field regions being in contact with one of the pair of field limiting regions on a boundary side in an opening formed in the insulating film, and reaching the other one of the pair of the field limiting regions on an outer edge side with the insulating film interposed therebetween.

DETAILED DESCRIPTION OF EMBODIMENTS

Figure 1:
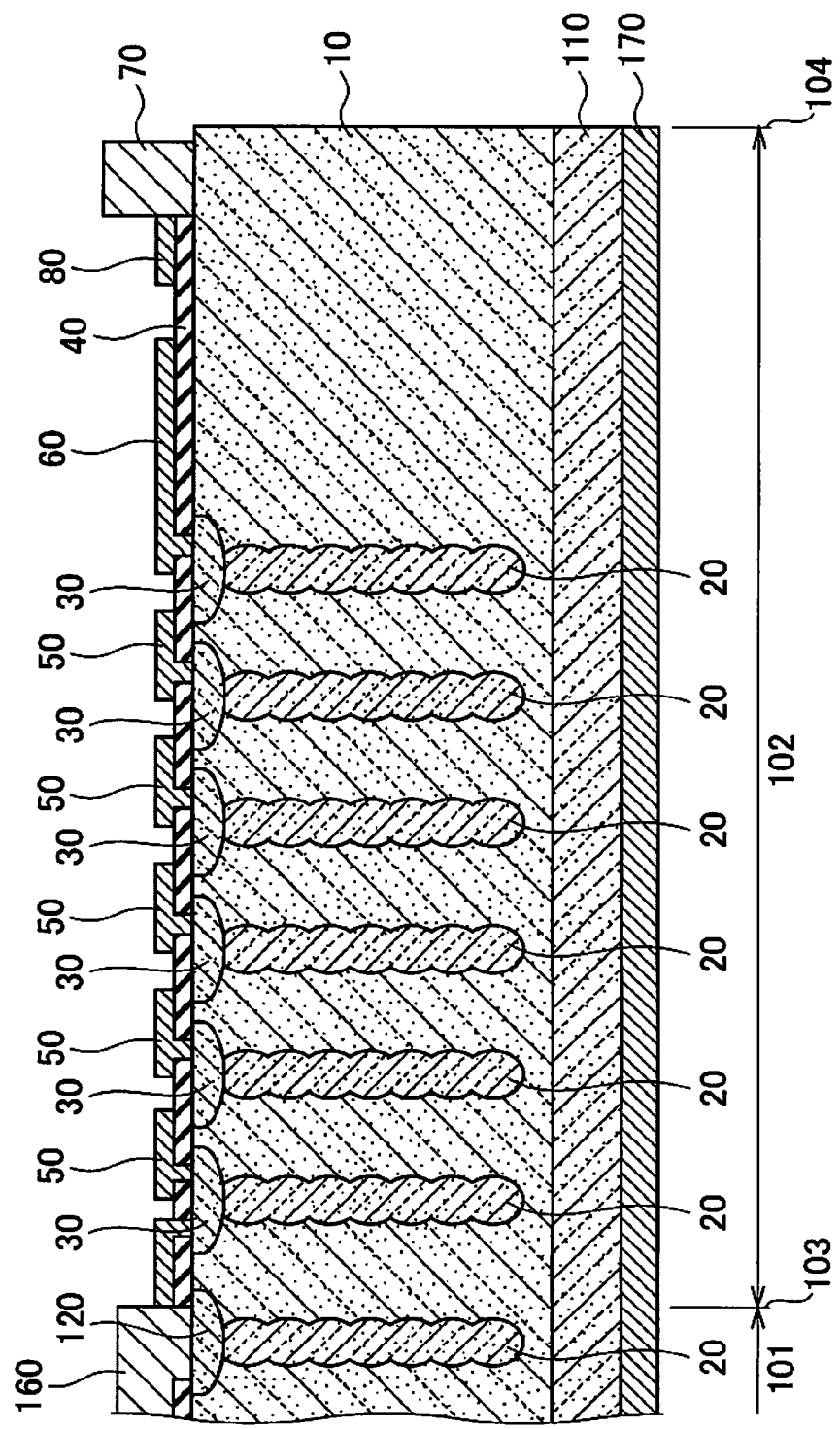
FIG. 1 is a schematic cross-sectional view illustrating a configuration of a semiconductor device according to an embodiment.

Next, a description is given of an embodiment of the invention with reference to the drawings. In the following description of the drawings, same or similar parts are given same or similar reference numerals. However, it should be noted that the drawings are schematic and the proportion of thickness of each layer and the like are different from real ones. Accordingly, the concrete thicknesses and dimensions should be determined with reference to the following description. It is certain that some portions have different dimensional relations and proportions between the drawings.

Moreover, the following embodiment shows examples of devices and methods embodying the technical idea of the invention. The embodiment does not restrict the materials, profiles, structures, arrangements, and the like of constituent parts to ones described below. The embodiment of the invention can be variously modified without departing from the claims.

As illustrated in FIG. 1, semiconductor device 1 according to an embodiment includes: element region 101 in which a semiconductor element is formed; and peripheral region 102 provided around element region 101. Semiconductor device 1 includes first conductivity-type semiconductor region 10 formed in element region 101 and peripheral region 102; and plural second conductivity-type columnar regions 20 formed in semiconductor region 10. By provision of columnar regions 20, plural pn junctions are formed in semiconductor region 10. Semiconductor device 1 has a super-junction (SJ) structure in which the first and second conductivity-type columnar regions are arranged adjacent to each other.

Figure 2:
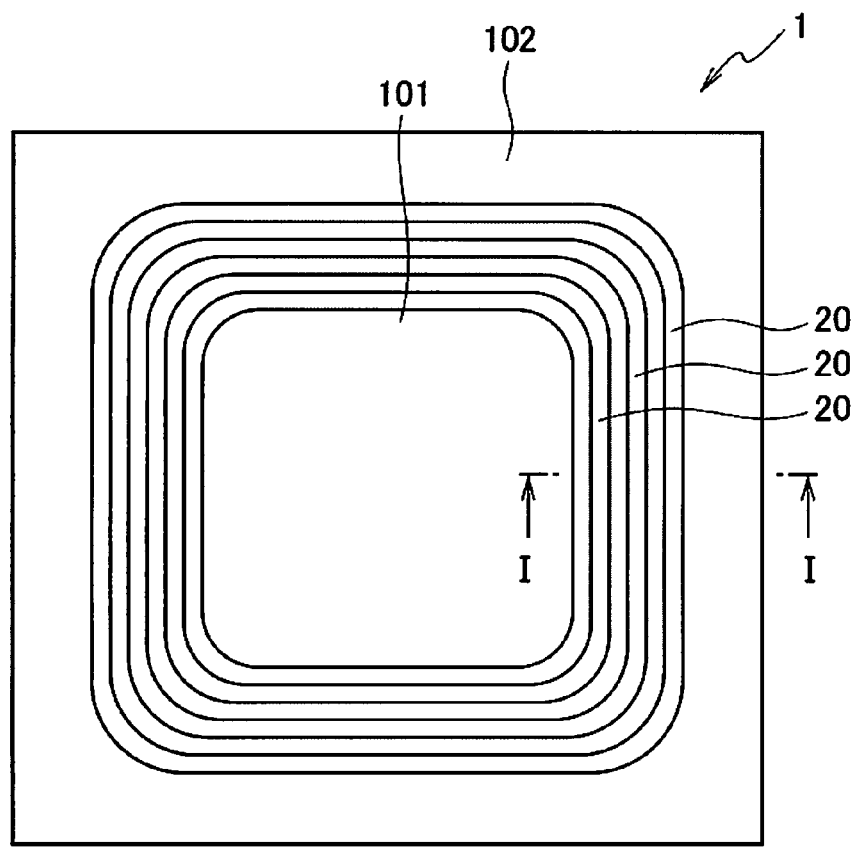
FIG. 2 is a schematic plan view illustrating an arrangement example of columnar regions in a peripheral region of the semiconductor device according to the embodiment.

As illustrated in FIG. 2, each columnar region 20 is arranged in a ring shape around element region 101. FIG. 1 is a cross-sectional view in a direction I-I of FIG. 2. FIG. 2 shows only columnar regions 20 for easy understanding of the structure. Moreover, three layers of columnar regions 20 are arranged in the example illustrated in FIG. 2, but more columnar regions 20 may be arranged in practice. In peripheral region 102, columnar regions 20 embedded in semiconductor region 10 run in parallel to each other in a wall-like fashion.

In peripheral region 102, second conductivity-type field limiting regions 30 are provided in the upper surface of semiconductor region 10. Field limiting regions 30 are connected to upper portions of at least some of columnar regions 20. In the example illustrated in FIG. 1, field limiting regions 30 are provided above all respective columnar regions 20. Field limiting regions 30 are arranged in many ring shapes around element region 101 and function as field limiting rings (FLRs). On semiconductor region 10 in peripheral region 102, insulating film 40 is provided so as to cover the upper surfaces of field limiting regions 30. The region of semiconductor device 1 including outer edge 104 is a first conductivity-type semiconductor region, and outer edge electrode 70 provided on the upper surface of semiconductor region is electrically connected to drain electrode 170.

The first and second conductivity-types are conductivity-types opposite to each other. To be specific, the first conductivity-type is n-type when the second conductivity-type is p-type, and the first conductivity-type is p-type when the second conductivity-type is n-type. In the following description, the first conductivity-type is n-type, and the second conductivity-type is p-type.

In peripheral region 102, each coupling plate electrode 50 is provided on insulating film 40 above two field limiting regions 30 (hereinafter, referred to as a pair of field limiting regions) which are arranged side by side in a direction from boundary 103 between element region 101 and peripheral region 102 to outer edge 104 of peripheral region 102. Each coupling plate electrode 50 is in contact with one of the corresponding pair of field limiting regions 30 on the boundary 103 side in an opening formed in insulating film 40. Moreover, an end of coupling plate electrode 50 at least reaches the other one of the pair of field limiting regions 30 on the outer edge 104 side with insulating film 40 interposed therebetween. The end of coupling plate electrode 50 on the outer edge 104 side may overlap corresponding field limiting region 30 in a plan view. Each coupling plate electrode 50 is capacitively coupled with field limiting region 30 on the outer edge 104 side.

In semiconductor device 1, plural field limiting regions 30, which are ring shaped and serve as FLRs, are formed around element region 101. According to semiconductor device 1, the joint structure of field limiting region 30—coupling plate electrode 50—field limiting region 30 forms a capacitive field plate structure in peripheral region 102. The potential in the surface of field limiting regions 30 can be thereby fixed, and the capacitance between coupling plate electrode 50 and field limiting region 30 can be changed. This can limit the electric field concentration well in peripheral region 102 when the semiconductor device 1 is reverse-biased. The breakdown voltage of semiconductor device 1 can be therefore increased. Coupling plate electrode 50 can be made of metallic film, polysilicon film, or the like.

In semiconductor device 1, how the voltage applied to semiconductor device 1 under reverse bias is divided depends on the arrangement of coupling plate electrodes 50, and the potential of each field limiting region 30 can be individually controlled at a desired level. In other words, the potential at each position in the surface of semiconductor region 10 can be controlled at a desired level. Accordingly, the depletion layer produced in semiconductor region 10 under reverse bias can be extended in a gently sloping manner toward the outer edge.

FIG. 1 shows an example in which all field limiting regions 30 are electrically connected to each other via coupling plate electrodes 50. However, it is unnecessary to electrically connect all field limiting regions 30 to joint field plat electrodes 50 as long as the depletion layer is formed in a continuous and gently sloping manner in semiconductor region 10. By arranging the coexistence of field limiting regions 30 electrically connected to coupling plate electrodes 50 and field limiting regions 30 not connected to coupling plate electrodes 50 in peripheral region 102, the potential at each location in semiconductor region 10 under reverse bias can be set to a desired level.

By desirably adding coupling plate electrodes 50 to plural field limiting regions 30 arrayed from boundary 103 toward outer edge 104 as described above, the potential in the surface of peripheral region 102 can be stably fixed. The breakdown voltage of semiconductor device 1 can be therefore increased.

As illustrated in FIG. 1, columnar regions 20 are formed deep in the film thickness direction. In the outer edge region of peripheral region 102, it is therefore necessary to prevent the depletion layer from sharply rising from columnar region 20 closest to the outer edge 104 to the surface of semiconductor region 10.

Semiconductor device 1 illustrated in FIG. 1, therefore, further includes outer field plate electrode 60 which is provided on insulating film 40 in the outer edge 104 side of columnar region 20 closest to outer edge 104. Outer field plate electrode 60 is connected to field limiting region 30 closest to outer edge 104. Outer field plate electrode 60 is made longer than coupling plate electrodes 50 in the direction from the boundary 103 to outer edge 104. This is to prevent the depletion layer formed deep in semiconductor region 10 by columnar regions 20 from steeply rising toward the surface of semiconductor region 10. In this manner, the depletion layer can be prevented by outer field plate electrode 60 from sharply rising in the outer edge region of peripheral region 102. The electric field concentration can be therefore limited effectively.

Figure 3:
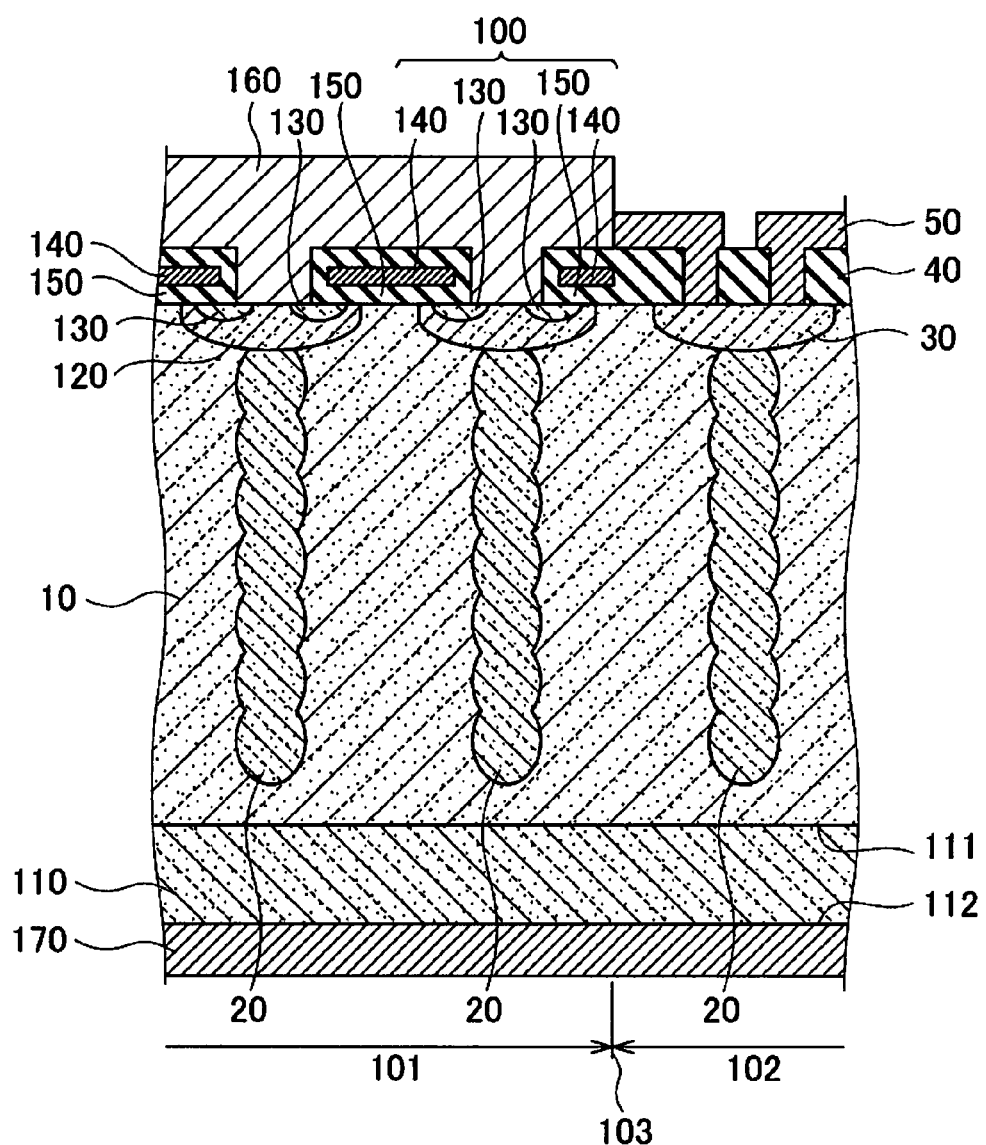
FIG. 3 is a schematic cross-sectional view illustrating a configuration of an element region of the semiconductor device according to the embodiment.

In element region 101, various types of semiconductor elements employing the SJ structure can be formed. For example, a field effect transistor (FET) is formed in element region 101 as illustrated in FIG. 3. Semiconductor element 100 illustrated in FIG. 3 has a structure in which columnar regions 20 are formed in semiconductor region 10 formed on first conductivity-type substrate 110. In semiconductor element 100, semiconductor region 10 is a drift region. Semiconductor element 100 further includes p-type base regions 120, n-type source regions 130, gate electrodes 140, gate insulating films 150, source electrode 160, and drain electrode 170.

Substrate 110 is an $n^+$-type semiconductor substrate obtained by doping a semiconductor substrate, such as a silicon (Si) substrate, with n-type impurities, for example. Substrate 110 functions as a drain region. $n^-$-type semiconductor region 10 as the drift region is provided on principal surface 111 of substrate 110. The impurity concentration in semiconductor region 10 is lower than that of substrate 110. Semiconductor region 10 is formed by growing an n-type epitaxial layer doped with phosphor (P) on an n-type silicon substrate densely doped with antimony (Sb) or the like, for example.

Columnar regions 20 are formed by selectively diffusing p-type impurities such as boron (B) in semiconductor region 10. An example of the method of forming columnar regions 20 is described later. In element region 101, columnar regions 20 extend side by side in stripes in a top view of semiconductor region 10 and run like wall shapes in parallel to each other.

Figure 4:
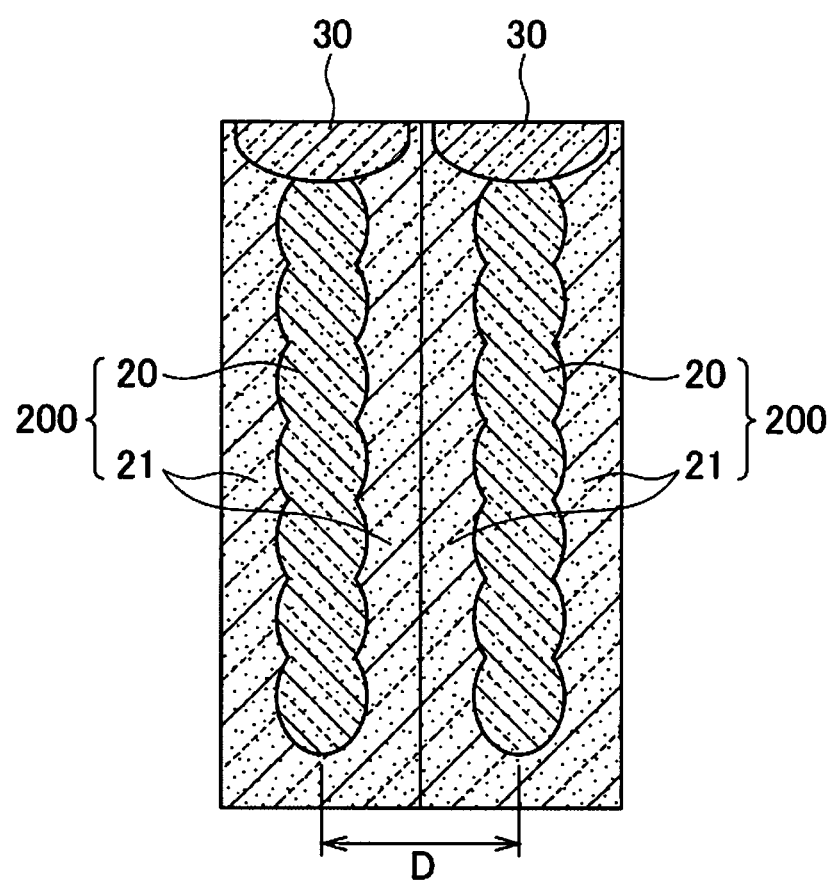
FIG. 4 is a schematic cross-sectional view illustrating a configuration example of cell units of the semiconductor device according to the embodiment.

Semiconductor region 10 has a structure in which plural cell units 200 are arranged side by side, each cell unit 200 including p-type columnar 20 and n-type peripheral region 21 around p-type columnar 20 as illustrated in FIG. 4. Peripheral regions 21 are residual region in semiconductor region 10 other than the regions where columnar regions 20 are formed.

All repetition distances (cell pitch) D between cell units 200 are set equal to each other. The cell pitch herein refers to a distance between the centers of columnar regions 20 adjacent to each other in a plan view. Columnar regions 20 are formed so as to have same depth and width.

The impurity concentration in base region 120 is set higher than that of columnar regions 20. As illustrated in FIG. 3, each base region 120 is provided in the upper surface of semiconductor region 10 and is connected to upper part of corresponding columnar region 20 in a similar manner to field limiting regions 30. Base regions 120 are formed by selectively doping boron (B) or the like in upper part of semiconductor region 10. In a process of forming base regions 120 in element region 101, field limiting regions 30 can be also formed in peripheral region 102.

Source regions 130 are formed within each base region 120 in an island fashion. Source regions 130 are exposed in the upper surface of semiconductor region 10.

Each gate electrode 140 is provided just above semiconductor region 10 and source regions 130 with gate insulating film 150 interposed therebetween. Channels are thereby formed in source regions 130 opposed to gate electrodes 140. Gate electrodes 140 are made of polysilicon film, for example. Gate insulating film 150 is made of silicon dioxide film, for example.

Source electrode 160 is an electrode for injecting electrons into source regions 130. Source electrode 160 is in ohmic contact with base and source regions 120 and 130. Drain electrode 170 is provided on the other principal surface 112 of substrate 110.

FIG. 3 shows a planar-type MOS structure, but can be replaced with a trench gate-type MOS structure.

There are roughly two types of methods for forming columnar regions 20. One is a multi-epilayer process which deposits multiple epitaxial layers, and the other is a deep trench process which embeds an epitaxial layer in a trench formed by etching the Si layer vertically deep. In the examples illustrated by FIGS. 1 and 3, columnar regions 20 are formed by the multi-epilayer process which is an application of the formation method of semiconductor region 10 illustrated in FIGS. 5A to 5E. Each columnar region 20 includes plural narrow portions in the depth direction. In other words, the cross section of each columnar region 20 in the direction vertical to the direction extending along the surface has a profile of plural ball-shaped regions connected in the depth direction.

Figure 5A:
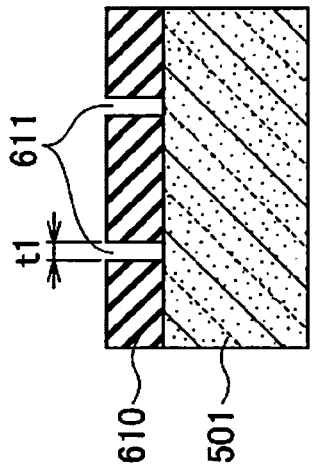
FIGS. 5A to 5E are schematic cross-sectional views illustrating an example of a method of forming the columnar regions, FIGS. 5A to 5E being cross-sectional process views (No. 1 to No. 5), respectively.

As illustrated in FIG. 5A, after first epitaxial layer 501 of the first conductivity-type is formed, impurity ions of the second conductivity-type are injected into predetermined regions of first epitaxial layer 501 using injection mask 610 including ion injection openings 611. For example, width t1 of ion injection openings 611 is set to 0.4 μm, and boron (B) as the p-type impurities is injected into n-type first epitaxial layer 501.

Figure 5B:
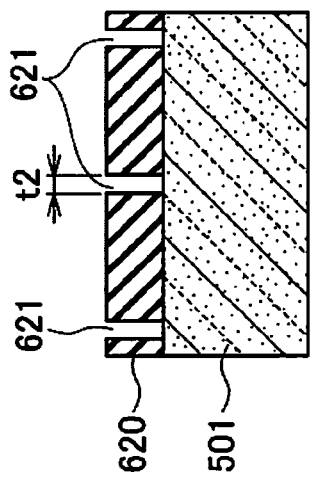
Figure 5C:
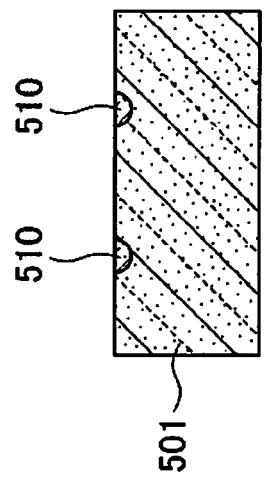

Next, as illustrated in FIG. 5B, using injection mask 620 including ion injection openings 621, impurity ions of the first conductivity-type are injected into first epitaxial layer 501. For example, width t2 of ion injection openings 621 is set to 0.4 μm, and phosphor (P) as the n-type impurities is injected into n-type first epitaxial layer 501. Thereafter, semiconductor regions 510 of the second conductivity-type are formed in first epitaxial layer 501 by an annealing process as illustrated in FIG. 5C.

Figure 5D:
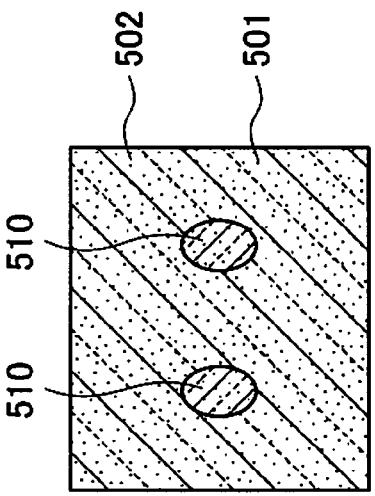
Figure 5E:
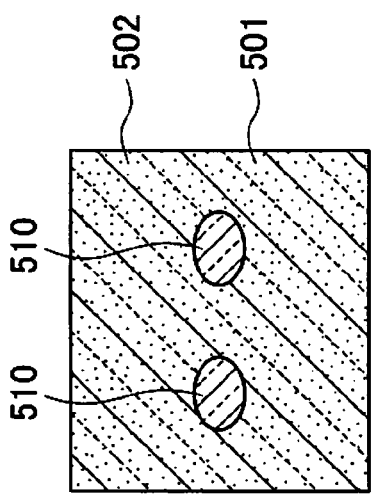

Next, as illustrated in FIG. 5D, second epitaxial layer 502 of the first conductivity-type is formed on first epitaxial layer 501. In this process, semiconductor regions 510 spread by thermal diffusion. Each semiconductor region 510 is then formed into a ball-like shape by a total drive process as illustrated in FIG. 5E.

Thereafter, in a similar manner to the aforementioned method, impurity ions of the second conductivity-type are injected into second epitaxial layer 502 using injection mask 610, and impurity ions of the first conductivity-type are injected into second epitaxial layer 502 using injection mask 620. Semiconductor regions 510 are thus formed in a similar manner to the method described with reference to FIGS. 5C to 5E.

By repeating the above-described processes, semiconductor regions 510 formed by each process further spread to be connected to each other, thus forming columnar regions 20.

According to the aforementioned formation method, not only the impurity ions of the second conductivity-type (p-type, for example) but also impurity ions of the first conductivity-type (n-type, for example) are injected into the first conductivity-type epitaxial layer. For example, n-type peripheral regions 21 of cell units 200 illustrated in FIG. 4 are formed as columnar regions by the ion injection as well as p-type columnar regions 20. This can provide an effect on facilitating adjustment of the ratio of total amounts of impurities in the SJ structure.

The magnitude of the breakdown voltage of semiconductor device 1 depends on the cell pitch D of cell units 200. In order to provide a stable high-breakdown voltage structure, the cell pitch D needs to be at least four times the thickness of semiconductor region 10 (epitaxial layer thickness). Such repetition distances and addition of coupling plate electrodes 50 to field limiting regions 30 can increase the breakdown voltage of semiconductor device 1.

Herein, a description is given of the on state of semiconductor element 100, which is an FET. Voltage is applied between drain electrode 170 and source electrode 160 so that the potential of drain electrode 170 is higher than that of source electrode 160. When a voltage not less than a threshold value is applied to gate electrode 140 in this state, carriers (electrons) accumulate in base regions 120 opposed to gate electrodes 140. Channels are thereby formed in base regions 120. The carriers injected from source electrode 160 travel through source regions 130, the channels of base regions 120, semiconductor region 10, and substrate 110 to reach drain electrode 170. In other words, current flows from drain electrode 170 to source electrode 160.

Next, a description is given of the off state of semiconductor element 100. When semiconductor element 100 is off, the depletion layer spreads between the columnar regions 20 in element region 101 and peripheral region 102. Electric field concentration is thereby controlled in the outside of element region 101. To be specific, field limiting regions 30 and coupling plate electrodes 50 joined to field limiting regions 30 limit the electric field concentration as described above.

As illustrated in FIG. 3, only field limiting region 30 closest to element region 101 is electrically connected to source electrode 160, which is one of main electrodes of semiconductor element 100 formed in element region 101. On the other hand, outer field plate electrode 60 is connected to outer edge electrode 70 in the outer edge portion of peripheral region 102. Outer edge electrode 70 is electrically connected to drain electrode 170, which is the other main electrode of semiconductor element 100. Outer field plate electrode 80 is provided on insulating film 40 and is connected to outer edge electrode 70.

Accordingly, how the voltage between source and drain electrodes 160 and 170 in peripheral region 102 is divided changes depending on the arrangement of coupling plate electrodes 50, and the potential of each field limiting region 30 can be controlled at a desired level. When high voltage is applied to between the source and drain electrodes 160 and 170, the potential of the surface of the peripheral region 102 is controlled by the field limiting regions 30 and coupling plate electrodes 50 so as to be lowered gradually. In the outer edge portion of peripheral region 102, the voltage is lowered enough, and the breakdown voltage can be therefore ensured by the structure in which outer field plate electrode 60 is connected to field limiting region 30 instead of the SJ structure.

Figure 6:
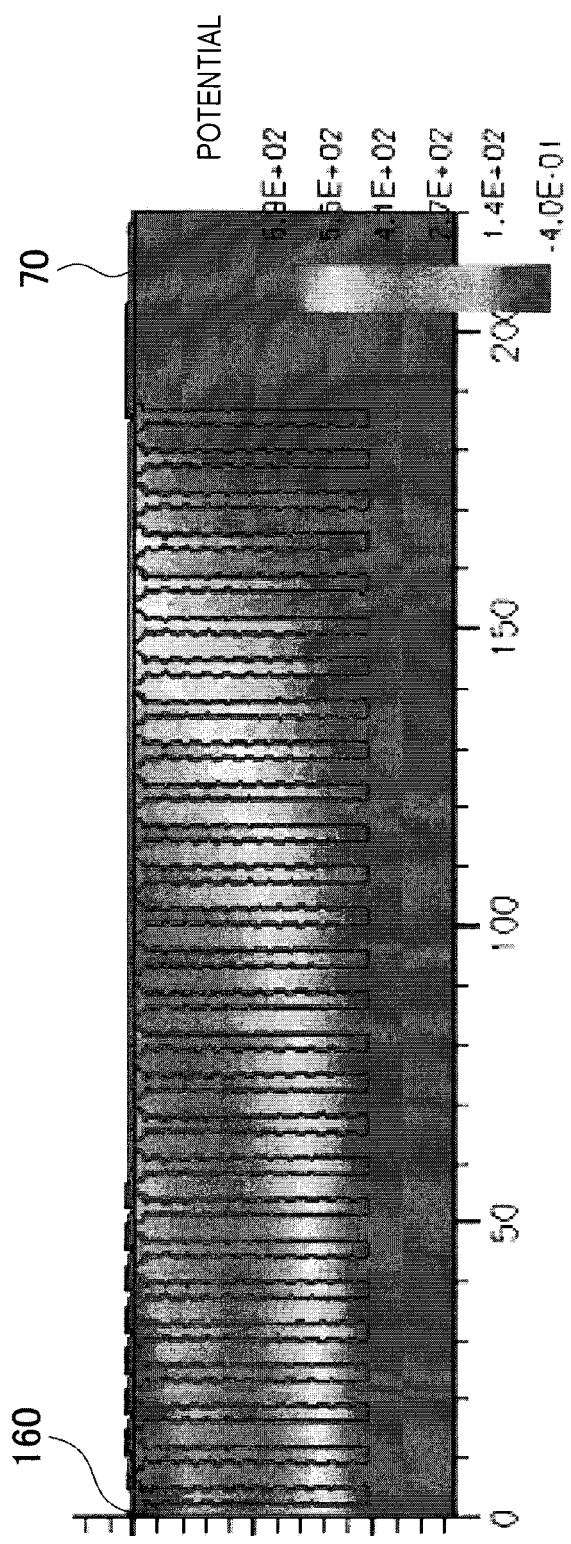
FIG. 6 is a schematic diagram illustrating a simulation result of a potential distribution of the semiconductor device according to the embodiment.

FIG. 6 shows a simulation result of a potential distribution when drain-source voltage Vds of 686 V is applied to semiconductor device 1. The potential distribution changes gently from source electrode 160 at the upper left end of FIG. 6 to outer edge electrode 70 at the upper right end. The impurity concentration of n-type semiconductor region 10 is 4E15 cm$^{-3}$.

Figure 7:
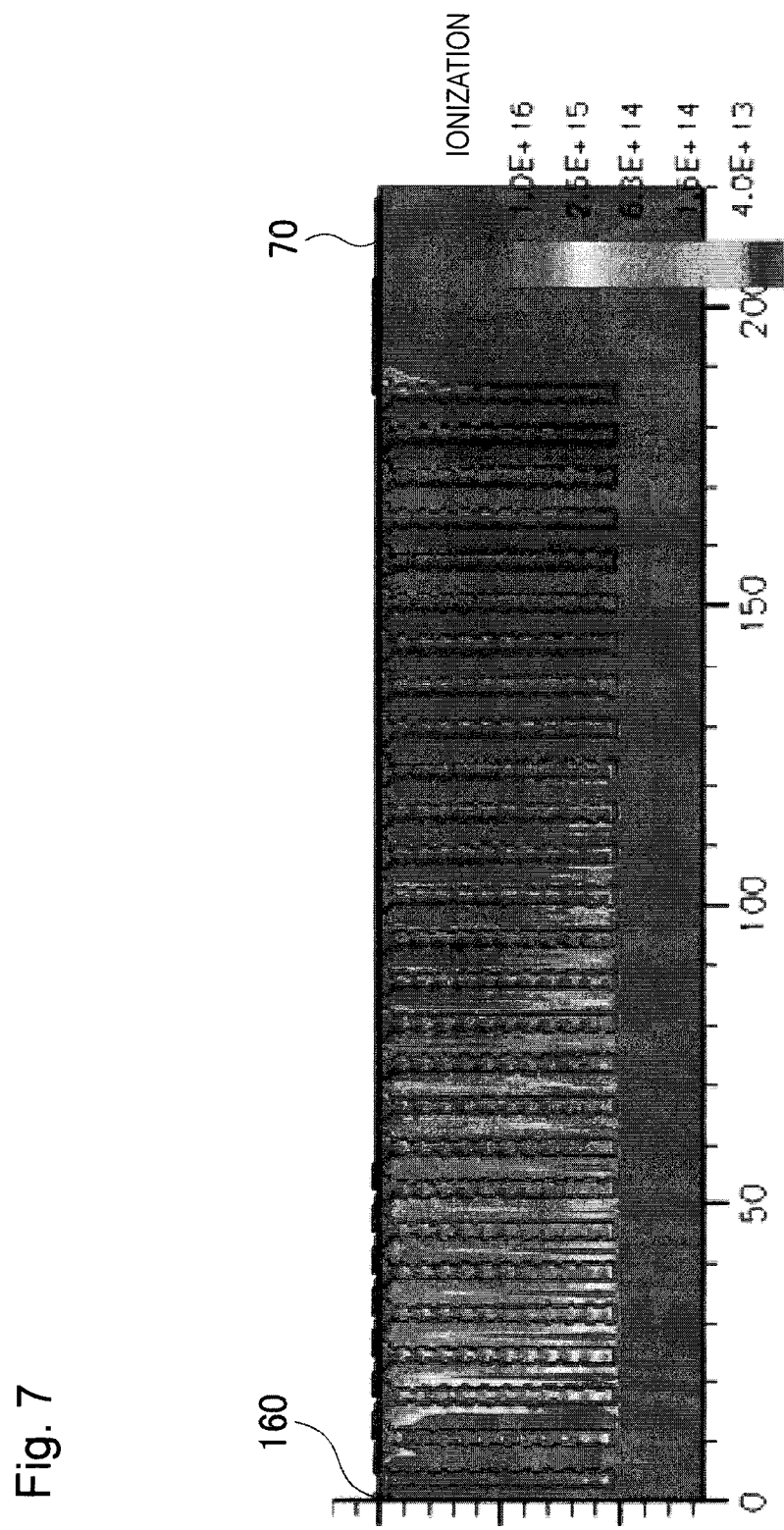
FIG. 7 is a schematic diagram illustrating a simulation result of an ionization distribution of the semiconductor device according to the embodiment.

FIG. 7 is a simulation result of an ionization distribution within semiconductor device 1 when drain-source voltage Vds of 686 V is applied. FIG. 7 shows an ionization distribution when breakdown occurs at the terminal portion and reveals where many electron/hole pairs are generated in semiconductor device 1. What should be noted is that ionization occurs in the junction with source electrode 160 at the upper left end and that no ionization is observed in the surface other than the junction with source electrode 160. If ionization occurs in the surface of field limiting regions 30 not connected to source electrode 160, soft breakdown occurs in the waveform of the drain-source voltage Vds. FIG. 7 is an ideal distribution of ionization, in which no ionization occurs in the surface.

Figure 8:
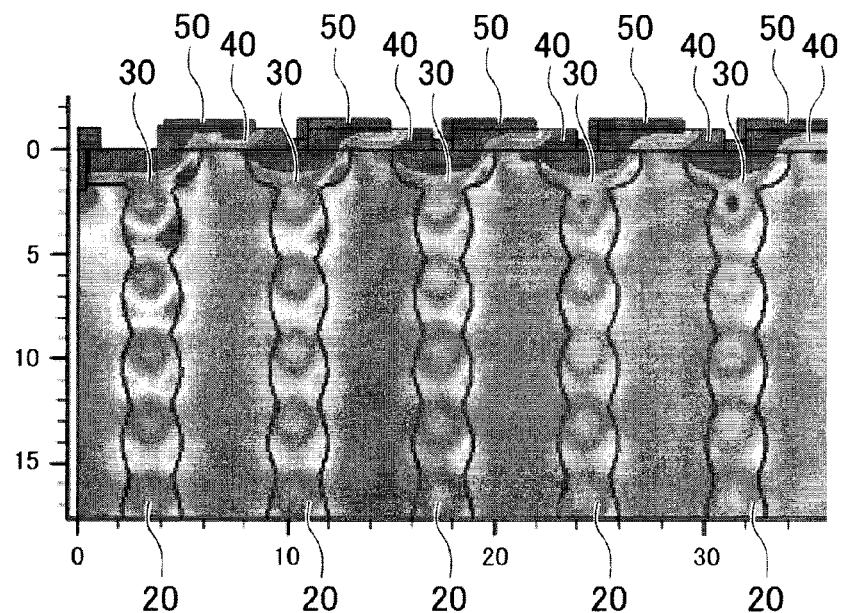
FIG. 8 is a schematic diagram illustrating a simulation result of a potential distribution of a semiconductor device including coupling plate electrodes.
Figure 9:
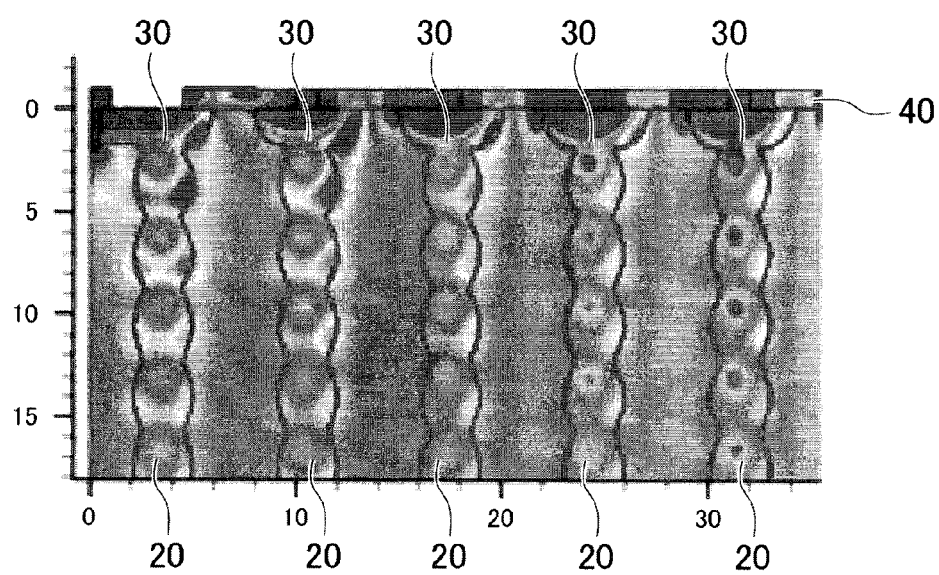
FIG. 9 is a schematic diagram illustrating a simulation result of a potential distribution of a semiconductor device not including any coupling plate electrode.
Figure 10:
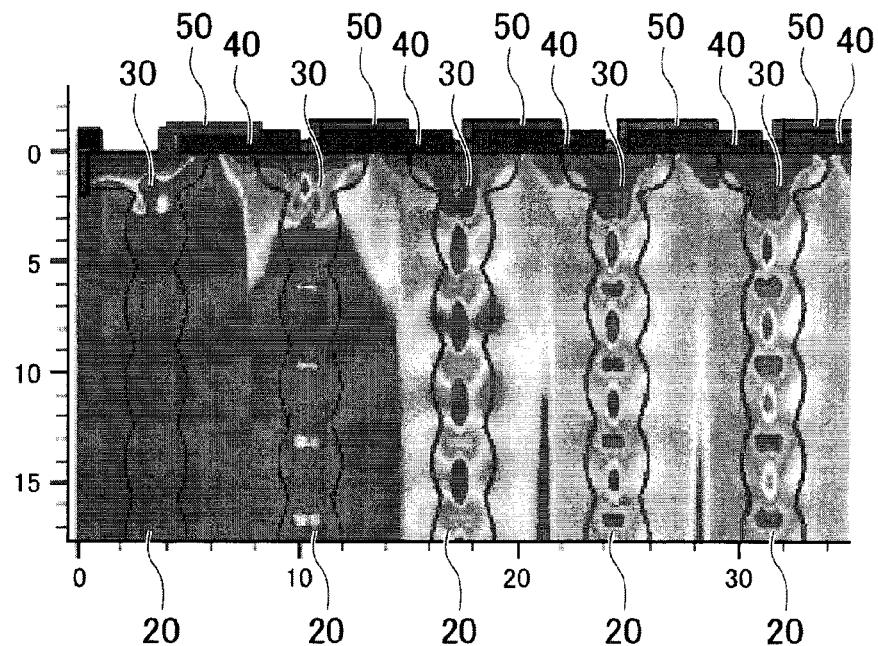
FIG. 10 is a schematic diagram illustrating a simulation result of an ionization distribution of the semiconductor device including the coupling plate electrodes.
Figure 11:
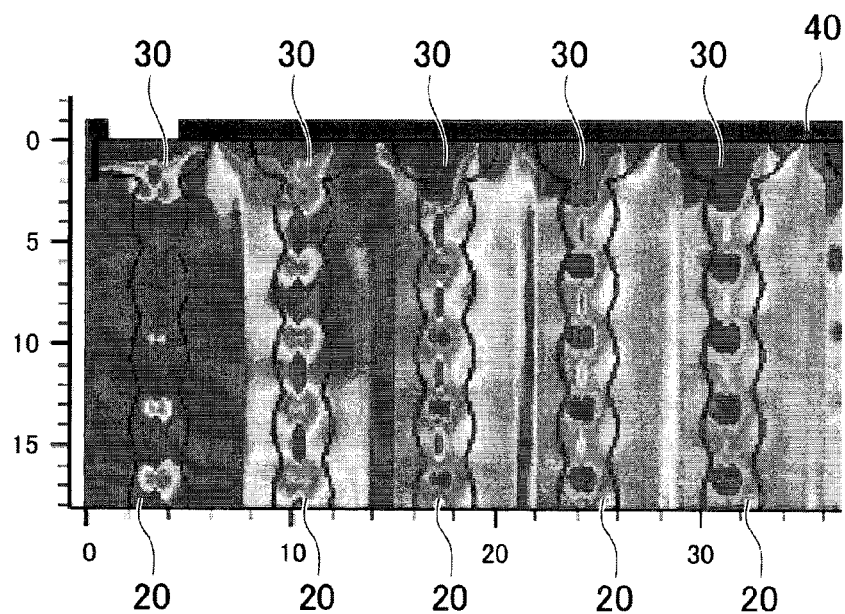
FIG. 11 is a schematic diagram illustrating a simulation result of an ionization distribution of the semiconductor device not including any coupling plate electrode.

FIG. 8 shows a simulation result of a potential distribution when coupling plate electrodes 50 are connected to field limiting regions 30. FIG. 9 shows a simulation result of a potential distribution in the absence of coupling plate electrodes 50. FIG. 10 shows a simulation result of an ionization distribution when the coupling plate electrodes 50 are connected to field limiting regions 30. FIG. 11 shows a simulation result of an ionization distribution in the absence of coupling plate electrodes 50.

According to examination of the simulation results, the breakdown voltage BVdss is 686 V when the coupling plate electrodes 50 are connected to field limiting regions 30 while the breakdown voltage BVdss is 655 V in the absence of coupling plate electrodes 50. In other words, the breakdown voltage is increased by connecting the coupling plate electrodes 50 to field limiting regions 30. FIGS. 9 and 11 reveal that the field intensity of each field limiting region 30 becomes high in the absence of coupling plate electrodes 50 and that ionization phenomena significantly occur in places other than the junction with source electrode 160. In an SJMOS with narrow columnar regions 20, soft breakdown in the waveform of drain-source voltage Vds therefore occurs at the terminal portion where there are no coupling plate electrodes 50. Accordingly, it is very effective that coupling plate electrodes 50 are connected to field limiting regions 30.

There is another method than semiconductor device 1 to gradually lower the potential in the outer edge region outside of the region where the columnar regions 20 are provided, in which a p-type low-concentration diffusion layer (RESURF) is additionally formed in the surface of semiconductor region 10 in the outer edge region, for example. This can deplete the surface of semiconductor region 10 in the outer edge region when the semiconductor device is reverse-biased. However, formation of the low-concentration diffusion layer requires a high-temperature heating process. By the high-temperature heating process, the columnar regions 20 spread horizontally, and the regions which on-current flows through are narrowed. This prevents reduction of the on-resistance of the semiconductor device.

On the other hand, in semiconductor device 1, field limiting regions 30 can be formed at the same time when base regions 120 are formed in element region 101. Field limiting regions 30 can be therefore formed by a part of the manufacturing process of semiconductor element 100. Accordingly, semiconductor device 1 does not require a special high-temperature heating process, such as the process of forming the low-concentration diffusion layer in peripheral region 102. It is therefore possible to prevent columnar regions 20 from horizontally spreading by heating, thus preventing semiconductor regions 10, through which on-current flows, from being narrowed. The on resistance of semiconductor device 1 can be therefore limited.

For example, the inventor forms columnar regions 20 with a width of 3 μm at cell pitch D of cell units 200 of 7 μm. The total thickness of the epitaxial layer is 42 μm. The on resistance (A·Ron) per unit area is 1.3 Ω/mm$^2$.

As described above, in semiconductor device 1 according to the embodiment, each coupling plate electrode 50 is located in peripheral region 102 so as to be directly connected to one of the corresponding pair of field limiting regions 30 adjacent to each other and be capacitively connected to the other field limiting region 30. This limits the electric field concentration under reverse bias and therefore increases the breakdown voltage of semiconductor device 1. Moreover, provision of outer field plate electrode 60 in the outer edge region of peripheral region 102 can prevent sharp rise of the depletion layer in the outer edge region of peripheral region 102. The electric field concentration can be therefore limited effectively.

Columnar regions 20 should be kept as narrow as possible for low on-resistance. Accordingly, it is preferable to form semiconductor device 1 by a process including fewer high-temperature heating steps to inhibit spread of columnar regions 20 due to heat diffusion. Fine coupling plate electrodes 50 connected to field limiting regions 30 are suitably made of polysilicon material formed at comparatively low temperature.

<Modification>

For the purpose of lowering the on-resistance of semiconductor device 1, it is preferable that the width of columnar regions 20 be narrow. When field limiting regions 30 are provided on the upper ends of all of such narrow columnar regions 20, field limiting regions 30 sometimes come into contact with each other due to the accuracy limit of the manufacturing process. When field limiting regions 30 come into contact with each other, electric field concentration cannot be limited, and the breakdown voltage is lowered. To avoid this, peripheral region 102 may be formed such that some field limiting regions 30 are omitted and the upper ends of some columnar regions 20 are not connected to any field limiting regions 30.

Figure 12:
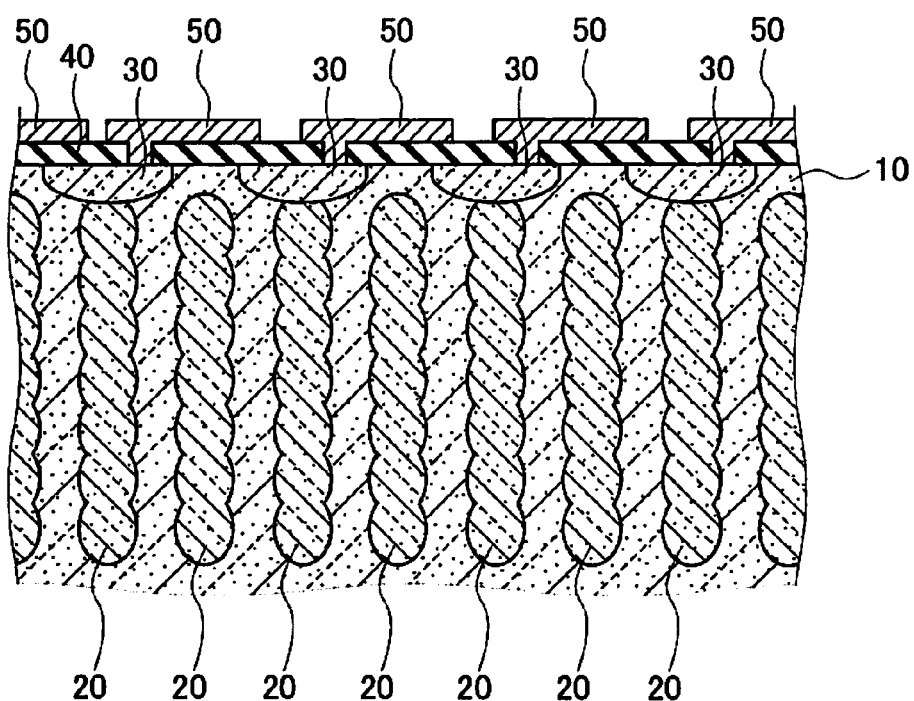
FIG. 12 is a schematic cross-sectional view illustrating a configuration of a semiconductor device according to a modification of the embodiment.

For example, as illustrated in FIG. 12, columnar regions 20 connected to field limiting regions 30 and columnar regions 20 not provided with the field limiting regions 30 so as not to be connected to any field limiting region 30 are alternately arranged between boundary 103 and outer edge 104. This can implement low on-resistance without bringing field limiting regions 30 into contact with each other.

The structure in which some of columnar regions 20 are not connected to field limiting regions 30 is effective when cell pitch D is about 3 μm, for example. Moreover, even in the case of the cell pitch D of 5 to 6 μm, it is preferable that columnar regions 20 not connected to field limiting regions 30 be arranged to maintain a certain distance between field limiting regions 30 when high breakdown voltage is required.

OTHER EMBODIMENTS

The invention is described using the embodiment as described above, but it should not be understood that the description and drawings constituting a part of the disclosure limit the invention. This disclosure reveals various alternative embodiments, examples, and operational techniques to those skilled in the art.

For example, the above description shows the example in which columnar regions 20 are formed by the multi-epilayer process. However, columnar regions 20 may be formed by the deep trench process.

In this way, for the purpose of increasing the breakdown voltage of a semiconductor device, it is effective to alleviate electric field concentration in the periphery of the semiconductor device. To alleviate the electric field concentration under reverse bias, the depletion layer produced in the semiconductor region is extended in a gently sloping manner toward the outer periphery of the semiconductor device. However, in the SJ structure, the p-type and n-type columnar regions are formed deep, and the depletion layer is produced deep inside the semiconductor region under reverse bias. Accordingly, the boundary of the depletion layer rises so steeply from the deep place to the surface in the outer edge of the semiconductor device that it is difficult to limit the electric field concentration.

Above-mentioned embodiment provides a semiconductor device with a super junction structure capable of alleviation the electric field concentration.

It is certain that the invention includes various embodiments not described herein and the like. Accordingly, the technical scope of the invention should be determined by only the features according to the claims, which are proper from the above description.

The invention claimed is:

1. A semiconductor device, comprising:
an element region in which a semiconductor element is formed;
a peripheral region provided around the element region;
a first conductivity-type semiconductor region formed in the element region and the peripheral region;
second conductivity-type columnar regions each provided in the semiconductor region of the peripheral region and formed in a ring shape surrounding the element region;
second conductivity-type field limiting regions arranged in the upper surface of the semiconductor region in the peripheral region and connected to upper portions of at least some of the columnar regions;
an insulating film provided on the semiconductor region in the peripheral region and covering the field limiting regions; and
a coupling plate electrode provided directly above a pair of the field limiting regions adjacent to each other in a direction from a boundary between the element region and the peripheral region to an outer edge of the peripheral region, the coupling plate electrode being in contact with one of the pair of the field limiting regions on a boundary side in an opening formed in the insulating film, and reaching the other one of the pair of the field limiting regions on an outer edge side with the insulating film interposed therebetween.

2. The semiconductor device according to claim 1, wherein the coupling plate electrodes are arranged between the boundary and the outer edge, and the field limiting regions and coupling plate electrodes are electrically connected one after another between the boundary and the outer edge.

3. The semiconductor device according to claim 1, further comprising an outer field plate electrode connected to the field limiting region closest to the outer edge,
wherein the outer field plate electrode is longer than each of the coupling plate electrodes in the direction from the boundary to the outer edge.

4. The semiconductor device according to claim 1, wherein the field limiting region closest to the element region is electrically connected to a main electrode of the semiconductor element formed in the element region.

5. The semiconductor device according to claim 1, wherein some of the columnar regions are not connected to the field limiting region.

6. A semiconductor device, comprising:
an element region in which a semiconductor element is formed;
a peripheral region provided around the element region;
a first conductivity-type semiconductor region formed in the element region and the peripheral region;
second conductivity-type columnar regions each provided in the semiconductor region of the peripheral region and formed in a ring shape surrounding the element region;
second conductivity-type field limiting regions arranged in the upper surface of the semiconductor region in the peripheral region and connected to upper portions of at least some of the columnar regions;
an insulating film provided on the semiconductor region in the peripheral region and covering the field limiting regions; and
a coupling plate electrode provided above a pair of the field limiting regions adjacent to each other in a direction from a boundary between the element region and the peripheral region to an outer edge of the peripheral region, the coupling plate electrode being in contact with one of the pair of the field limiting regions on a boundary side in an opening formed in the insulating film, and reaching the other one of the pair of the field limiting regions on an outer edge side with the insulating film interposed therebetween,
wherein some of the columnar regions are not connected to the field limiting region, and
wherein the columnar regions connected to the field limiting regions and the columnar regions not connected to the field limiting regions are alternately arranged between the boundary and the outer edge.

7. The semiconductor device according to claim 1, wherein each of the columnar regions has such a profile that ball-shaped regions are connected in a depth direction.

8. The semiconductor device according to claim 1, wherein the field limiting regions connected to the coupling plate electrodes and the field limiting regions not connected to the coupling plate electrodes coexist in the peripheral region.

9. The semiconductor device according to claim 1, wherein the coupling plate electrodes are made of a polysilicon material.

* * * * *